United States Patent
Pfeuffer

(10) Patent No.: US 7,754,019 B2
(45) Date of Patent: Jul. 13, 2010

(54) METHOD FOR REMOVING PARTICLES FROM A SEMICONDUCTOR SURFACE

(75) Inventor: Alexander Pfeuffer, Villach (AT)

(73) Assignee: Lam Research AG, Villach (AT)

( * ) Notice: Subject to any disclaimer, the term of this patent is extended or adjusted under 35 U.S.C. 154(b) by 252 days.

(21) Appl. No.: 11/887,923

(22) PCT Filed: Mar. 23, 2006

(86) PCT No.: PCT/EP2006/060987

§ 371 (c)(1), (2), (4) Date: Oct. 5, 2007

(87) PCT Pub. No.: WO2006/106045

PCT Pub. Date: Oct. 12, 2006

(65) Prior Publication Data

US 2009/0050176 A1 Feb. 26, 2009

(30) Foreign Application Priority Data

Apr. 5, 2005 (AT) ................ A 576/2005

(51) Int. Cl.
*B08B 3/04* (2006.01)
(52) U.S. Cl. .................................. 134/7; 134/34
(58) Field of Classification Search .......... 134/7, 134/34
See application file for complete search history.

(56) References Cited

U.S. PATENT DOCUMENTS

| 4,050,954 | A | * | 9/1977 | Basi | .............................. 134/2 |
| 5,593,339 | A | * | 1/1997 | Yam et al. | ...................... 451/36 |
| 5,846,335 | A | | 12/1998 | Maekawa et al. | |
| 6,200,899 | B1 | | 3/2001 | Fournier | |
| 6,274,059 | B1 | | 8/2001 | Krusell et al. | |
| 6,465,403 | B1 | | 10/2002 | Skee | |
| 2003/0228738 | A1 | * | 12/2003 | Beaudoin | ..................... 438/459 |
| 2004/0226918 | A1 | * | 11/2004 | Lee et al. | ....................... 216/89 |
| 2006/0128600 | A1 | * | 6/2006 | Freer et al. | ................... 510/491 |

FOREIGN PATENT DOCUMENTS

| EP | 0 390 134 A | 10/1990 |
| EP | 1 122 767 A | 8/2001 |
| WO | WO 02065529 | 8/2002 |
| WO | 2004/053968 A1 | 6/2004 |

\* cited by examiner

*Primary Examiner*—Michael Kornakov
*Assistant Examiner*—Natasha Campbell
(74) *Attorney, Agent, or Firm*—Young & Thompson

(57) ABSTRACT

Method for cleaning a surface is disclosed comprising a cleaning step with an aqueous cleaning medium, which is supplied to said semiconductor surface wherein the cleaning medium comprises cleaning particles suspended in a colloidal form and mechanical agitation is applied to the particles to be removed for at least part of the time during the cleaning step.

13 Claims, No Drawings

METHOD FOR REMOVING PARTICLES FROM A SEMICONDUCTOR SURFACE

BACKGROUND OF THE INVENTION

The invention relates to a method for removing particles from a surface. Methods for removing particles from a surface are typically used in semiconductor industry for cleaning silicon wafers during production processes (e.g. pre photo clean, post CMP-cleaning, post plasma cleaning). However, such a cleaning method may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

DESCRIPTION OF THE RELATED ART

In the semiconductor industry particle removal from silicon wafers is performed by hot mixtures of deionised water (DI), hydrogen peroxide, ammonia water (e.g. 5:2:1 to 50:2:1 at 60 to 80° C.), the so-called "Standard Clean #1 (SC-1)". Hydrogen peroxide is provided as aqueous solution with a concentration of about 31 wt. %. Ammonia water (ammoniac) is provided as aqueous solution of ammoniac with a concentration of about 28 wt. %.

The cleaning mechanism of SC-1 comprises two major steps. The first step is etching of silicone dioxide, which is a natural passivation layer on silicon (e.g. called native oxide). The second step is repulsion of loosened particles and surface from each other.

The native oxide layer on top of the silicon wafer is slowly etched at high pH above 7 due to hydroxide ions. A significant etch-rate starts at a pH above 10 (at 25° C.). This causes under-etching of particles attached to the native oxide wafer surface. The hydrogen peroxide oxidizes silicon to silicon dioxide, renews hereby the oxide layer and thus protects the bulk material of the wafer from uncontrolled etching by hydroxide ions.

The major disadvantage of SC-1 is that the surface of the substrate is etched. It is not desired any more in the semiconductor industry that substrates are etched during cleaning. Layers on a substrate shall no longer be thinned by cleaning.

Metallic and metal ion contaminants are removed from silicon wafers by mixtures of deionised water (DI), hydrogen peroxide and hydrochloric acid (e.g. 7:2:1 to 50:2:1 at 60 to 80° C.), the so-called "Standard Clean #2 (SC-2)". Hydrogen peroxide is provided as aqueous solution with a concentration of about 31 wt. %. Hydrochloric acid is provided as aqueous solution of hydrogen chloride with a concentration of about 37 wt. %. Under acidic pH conditions metal cations come off from a silicon surface and some special cations are complexed by chloride ions. But it is well-known in the semiconductor industry that SC-2 has no useful ability of removing particles.

SUMMARY OF THE INVENTION

It is an object of the invention to provide a particle removal process, which substantially avoids any corrosion or any substrate material loss, when it is applied. A further object of the invention is to provide a method, which can combine particle removal with metal or metal ion contaminant removal. A further object of the invention is to provide a method, which avoids the use of any costly or environmental harmful chemicals.

The invention meets the objects by providing a method for removing particles from a semiconductor surface the method comprising a cleaning step wherein an aqueous cleaning medium is supplied to said semiconductor surface. Said cleaning medium comprises cleaning particles suspended in a colloidal form. Furthermore mechanical agitation is applied to the particles to be removed for at least part of the time during the cleaning step.

The cleaning medium can either be supplied by immersing the semiconductor wafer with said semiconductor surface into said cleaning medium or by dispensing said cleaning medium onto said surface of the semiconductor wafer. Mechanical agitation can e.g. be supplied by ultrasonic sound energy, spray nozzle or brushing.

The mechanical agitation of the particle to be removed can be applied through agitation of the liquid or agitation of the substrate.

Such agitation of the liquid can be selected from the group comprising ultrasonic energy, applying accelerated droplets, dispensing a continuous liquid beam, rotating the plate like article, flowing across the surface of a plate like article at a flow sufficient fast to generate a mean velocity v parallel to the surface of a plate like article of minimum 0.1 m/s. Another possibility of agitation of the liquid is by light. In this case small vapour bubbles (micro bubbles) are generated by laser light in close proximity (distance<1 μm) to the respective particle and thereby inducing a micro shockwave.

Preferably the cleaning particles consist of an inorganic material because substrate and most layers in semiconductor industry consist of inorganic material. However, if organic surfaces shall be cleaned, (e.g. organic low-k material) colloid particles consisting of organic material may be preferably used.

DETAILED DESCRIPTION

In a preferred embodiment of the invention cleaning particles consist of a material being chemically identical to at least one material of the surface to be cleaned. This is because van-der-waals forces and electrostatic forces between particles and the substrate to be cleaned on the one hand and such forces between particles and cleaning particles (colloids), which consist of substrate material, on the other hand are identical. Therefore particles have at least the same affinity to the cleaning particles as to the substrate to be cleaned.

If e.g. silicon wafers are to be cleaned the cleaning particles consist preferably of colloidal silicon dioxide (colloidal silica) because silicon typically forms a native oxide as a passivation layer on silicon. Such colloidal silica is available e.g. at Grace (Ludox®) or H.C. Starck (Levasil®). Colloidal silica is preferred because it is industrially available at sufficient purity.

An advantageous average particle size is in the range of 1 to 100 nm (preferably 3 to 30 nm). Small particles are not considered as "killer particles", if deposition of colloids made of substrate material on the substrate occurs.

If devices on the semiconductor surface have a specific minimum device size it is preferred that the average particle size of the cleaning particles is smaller than half of the minimum device size. In semiconductor industry the minimum device size varies in a range of 250 nm to current 45 nm and is expected to reach 10 nm at some point in the future.

In another embodiment the concentration of particles in the cleaning medium is in the range of 0.0001 to 1 g/l (preferably 0.001 to 0.01 g/l). On the one hand a minimum number of colloid particles is helpful to achieve a good cleaning efficiency. On the other hand too many colloid particles increase the risk of coagulation and of attachment of colloids to substrate's surface.

The particles advantageously have a specific particle surface of above 100 m$^2$/g (preferably above 200 m$^2$/g). The specific particle surface is a reliable way to declare particle size of powders. A Scanning Electron Microscope can be used for determining particle size. However, the average particle size is typically characterized by using specific particle surface (m$^2$/g). The specific particle surface of dry powders can be determined with the nitrogen adsorption method (BET-value).

The specific particle surface of colloidal silica (e.g. H.C. Starck Levasil®) can be roughly estimated by the grade of turbidity. Silica suspensions with a specific particle surface below 100 m$^2$/g appear as a milky liquid, below 200 m$^2$/g the liquid opalescences and above 300 m$^2$/g the suspension is almost clear.

In yet another embodiment the cleaning medium has an ionic strength of below 2 mol/l. Ionic strength determines the distance of approach between colloid particles made of substrate material and substrate respectively with the to be cleaned particles. Above an ionic strength of 2 mol per liter no repulsion between particles made of surface material and the surface material itself occurs.

In another embodiment the cleaning medium has a pH-value of below 10 (preferably 9). With a low pH value (preferably below 7) simultaneous removal of metal or metal ion contaminations is possible.

Such a cleaning solution may further comprise an oxidizing agent (preferably hydrogen peroxide or ozone). Preferred concentration of the oxidizing agent is 10 ppm to 10 wt. % (more preferably 100 ppm to 1%). Oxidizing agents are used for removal of organic or metallic contaminants and may act as an oxygen reservoir, which supports bubble formation (cavitation) during megasonic cleaning.

For enhancing the decomposition of the oxidizing agent a catalyst can be added to the cleaning solution (e.g. I$^-$ ion and OH$^-$ for hydrogen peroxide, Cl$^-$ ion for ozone). Alternatively gases dissolved in DI-Water (e.g. CO$_2$) can be used as gas reservoir, too.

The cleaning solution may comprise a wetting agent, which further supports loosening of particles, which are to be removed, from the surface. E.g. 2-propanol or acetone are useful because they easily vaporise and thus do not leave any stains on the surface.

The cleaning solution may also comprise a complexing agent, which supports the removal of some metallic ions. E.g. EDTA can be useful because it is very stable in oxidizing environments.

Advantageously the method further comprises a rinsing step after the cleaning step with an aqueous rinsing medium wherein the rinsing medium substantially does not contain particles. Preferably the rinsing step is carried out subsequent to the cleaning step without an intermediate drying of the surface. Direct chemical bonding between substrate and colloids made of substrate surface material is only possible after physical contact, i.e. after drying. Thereby colloid particles, which may consist of surface material, can be removed from the substrate more easily during a rinse step by mechanical agitation. Advantageously the rinsing step is started before the cleaning step is stopped. In an immersion tool (e.g. wet bench) the particle containing cleaning medium can be directly displaced by the rinsing liquid (e.g. DI-Water or dilute acids).

The mechanical agitation is advantageously applied through ultrasonic energy (preferably megasonic at 1 to 2 MHz). Such mechanical agitation by ultrasonic energy can either be applied through ultrasonic agitation of the liquid or ultrasonic agitation of the substrate. There should be some liquid between the particle and the substrate in order to reduce van-der-waals and electrostatic forces by the cleaning medium. In order to attain this thin intermediate liquid layer, between the particle and the substrate a minimum of mechanical impact is favourable.

Each thinkable combination of the above-mentioned embodiments is considered to be covered by the scope of the invention.

Further details and advantages of the invented method will become apparent by the examples below.

Per example the invented cleaning method was carried out as follows:

Fully immersing a silicon wafer carrying Si$_3$N$_4$ monitor particles in a cleaning solution (as listed in examples A, B, C, D, E)

Applying ultrasound agitation (1500 kHz) for one minute at 60° C.

Rinsing with DI-Water for one minute under ultrasound agitation at 25° C.

Drying under nitrogen atmosphere

EXAMPLE A (COMPARATIVE EXAMPLE)

Strong acidic SC-2 mixture (DI-Water:H$_2$O$_2$ (31 wt. %):HCl (37 wt. %)=11:1:1 (volumetric ratio)). This leads to an aqueous solution of 0.93 mol/l HCl, 0.77 mol/l H$_2$O$_2$ at a pH value of 0.03.

RESULT

Does not remove under ultrasound agitation (1500 kHz) any Si$_3$N$_4$ monitor particles from silicon wafer.

EXAMPLE B

Strong acidic SC-2 mixture (DI-Water:H$_2$O$_2$ (31 wt. %):HCl (37 wt. %):colloidal silica (34 wt. %, Ludox® TMA)=11:1:1:0.01 (volumetric ratio)). This leads to a solution of 0.93 mol/l HCl, 0.77 mol/l H$_2$O$_2$ at a pH value of 0.03 with 0.031 wt. % colloidal silica.

RESULT removes under ultrasound agitation Si$_3$N$_4$ monitor particles from silicon wafer. Surprisingly by adding a small amount of colloid silica to SC-2 the well known solution is now able to remove particles.

EXAMPLE C

Slightly acidic 1 molar NH$_4$Cl solution (salt solution:colloidal silica dispersion (34 wt. %, Ludox® TMA)=10:0.01 (volumetric ratio)) with 0.041 wt. % colloidal silica at pH=4.625.

EXAMPLE D

Acidic mixture (DI-Water:HCl (37 wt. %):NH$_3$ (28 wt. %):colloidal silica (34 wt. %, Ludox® TMA)=27:1.5:1:0.03 (volumetric ratio)). This leads to a solution of 0.6 mol/l Cl$^-$, 0.5 mol/l NH$_4^+$ at a pH value of 1.00 with 0.041 wt. % colloidal silica.

EXAMPLE E

Alkaline SC-1 solution (DI-Water:H$_2$O$_2$ (31 wt. %):NH$_3$ (28 wt. %):colloidal silica (34 wt. %, Ludox® TMA)=12:2:

1:0.01 (volumetric ratio)). This leads to a solution of 0.96 mol/l $NH_3$, 1.35 mol/l $H_2O_2$ at a pH value of 9.6 (at process conditions at 60° C. and 10.4 at 25° C.) with 0.03 wt. % colloidal silica.

Ludox® TMA as used in above-mentioned examples contains colloidal silica with 22 nm average particle diameter (=140 $m^2$/g specific surface area and pH 4-7. This colloidal silica is good for minimum device sizes down to 45 nm. For smaller device sizes Ludox® SK with 12 nm average particle diameter (=230 $m^2$/g specific surface area) and pH 4-7 can be used.

Above-mentioned embodiments according to the invention (examples B, C, D, E) lead to perfect cleaning efficiency (over 99% particles could be removed) at no detectable etch rate of the substrate (examples B, C, D). Example E showed a slight surface roughening. Surprisingly all examples (B, C, D, E) with liquids comprising colloidal silica showed significant better particle removal efficiency that the respective liquids without colloidal silica.

Alternatively a patterned silicon wafer can be treated as follows:

The wafer is placed into a device for treating disc-shaped articles as described in WO2004/114372A1. A wafer is placed between two parallel plates (a first and a second plate) in parallel to said plates. The wafer is securely held by gripping pins projecting from the first plate. The second plate comprises ultrasonic transducers and thus the second plate serves as a so called transducer plate. Simultaneously both sides of the wafer are wetted with a cleaning solution e.g. according to the above-mentioned example B. The solution is introduced into the first gap (between the wafer and the first plate) from an orifice near the centre of said first plate. The solution is introduced into the second gap (between the wafer and the second plate) from an orifice near the centre of said second plate. Both solution flows (flow to first and second gap) are kept in a range of 0.5 to 2 l/min. Both gaps have a distance of about 2 mm. The ultrasonic transducers of the second plate introduce ultrasonic energy (e.g. in the range of 1000 to 3000 kHz). After this cleaning step the cleaning solution comprising the colloidal silica is directly displaced by de-ionised water (DI) or dilute acid. Hence no intermediate drying of the wafer surfaces can occur before the colloidal silica is displaced from the gaps. The DI-Water is displaced by nitrogen gas being introduced into both gaps simultaneously. The system is thereafter opened and the cleaned wafer picked from the cleaning device.

Alternatively between the cleaning step with the cleaning solution comprising the colloid particles and the DI rinsing step a second cleaning solution comprising the same concentrations as the first cleaning solution however not comprising colloid particles (e.g. according to example A) can be applied.

Alternatively before the cleaning step with the cleaning solution comprising the colloid particles a first pre-cleaning liquid can be applied. E.g.: First pre-cleaning liquid (DI-Water:HCl (37 wt. %):HF (49 wt. %)=11:1:0.01) is applied for 30 seconds at 25° C., thereafter the cleaning solution comprising the colloid particles (DI-Water:HCl (37 wt. %):colloidal silica (34 wt. %, Ludox® TMA)=11:1:0.01 (volumetric ratio)) is applied for another 30 seconds at 25° C.

The first pre-cleaning liquid in this example is useful for loosening particles by slightly underetching the particles.

Without being bound to any theory it is believed that the cleaning method according to the invention consists of two major effects, which are mechanical impact of the ultrasound agitation and particle masking with substrate material colloids (e.g. silica).

If the mechanical force was not sufficient for removing the particle completely from the substrate, the particle remains on the substrate with a few layers of water between it and the substrate. These particles are still strongly bound to the substrate by short range van-der-waals forces. Addition of small substrate material colloids, which are attracted by the particles but not by the substrate, reduces van-der-waals forces and leads to particle lift off. Additionally removed particles are covered by substrate material colloids and reattachment is strongly suppressed.

The invention claimed is:

1. A method for removing contaminant particles from a semiconductor surface, the method comprising a cleaning step wherein an aqueous cleaning medium is supplied to said semiconductor surface wherein the cleaning medium comprises cleaning particles consisting of colloidal silica and mechanical agitation is applied to the particles to be removed for at least part of the time during the cleaning step, wherein the cleaning medium has a pH-value below 9.

2. The method according to claim 1, wherein cleaning particles consist of a material being chemically identical to at least one material of the surface to be cleaned.

3. The method according to claim 1, wherein the average particle size of the cleaning particles is in the range of 1 to 100 nm.

4. The method according to claim 1, wherein devices on the semiconductor surface have a specific minimum device size and the average particle size of the cleaning particles is smaller than half of the minimum device size.

5. The method according to claim 1, wherein the concentration of particles in the cleaning medium is in the range of 0.0001 to 1 g/l.

6. The method according to claim 1, wherein the cleaning particles have a specific particle surface of above 100 $m^2$/g.

7. The method according to claim 1, wherein the cleaning medium has an ionic strength of below 2 mol/l.

8. The method according to claim 1, wherein said cleaning medium comprises an oxidizing agent.

9. The method according to claim 1, wherein said cleaning medium further comprises a wetting agent.

10. The method according to claim 1, further comprising a rinsing step after the cleaning step with an aqueous rinsing medium wherein the rinsing medium substantially does not contain particles.

11. The method according to claim 10, wherein the rinsing step is carried out subsequent to the cleaning step without an intermediate drying of the surface.

12. The method according to claim 10, wherein the rinsing step is started before the cleaning step is stopped.

13. The method according to claim 1, wherein the mechanical agitation is applied through ultrasonic energy.

* * * * *